(12) United States Patent
Shinohara (10) Patent No.: US 7,102,110 B2
(45) Date of Patent: Sep. 5, 2006

(54) MAGNETRON OSCILLATING APPARATUS

(75) Inventor: Kibatsu Shinohara, Kanagawa (JP)

(73) Assignee: Nihon Koshuha Co., Ltd, Kanagawa (JP)

( * ) Notice: Subject to any disclaimer, the term of this patent is extended or adjusted under 35 U.S.C. 154(b) by 0 days.

(21) Appl. No.: 11/097,610

(22) Filed: Mar. 30, 2005

(65) Prior Publication Data

US 2005/0218813 A1 Oct. 6, 2005

(30) Foreign Application Priority Data

Mar. 31, 2004 (JP) .............................. 2004-106381

(51) Int. Cl.
H05B 6/68 (2006.01)
(52) U.S. Cl. ...................... 219/717; 219/715; 219/702
(58) Field of Classification Search ...................... None
See application file for complete search history.

(56) References Cited

U.S. PATENT DOCUMENTS

| | | | | |
|---|---|---|---|---|
| 3,591,826 A | * | 7/1971 | Valles ......................... 315/104 |
| 5,012,058 A | * | 4/1991 | Smith ......................... 219/716 |
| 5,053,682 A | * | 10/1991 | Shoda et al. ................. 315/223 |
| 5,347,236 A | * | 9/1994 | Neuharth et al. ............. 331/87 |
| 6,774,567 B1 | * | 8/2004 | Jang et al. ............... 315/39.51 |
| 6,998,591 B1 | * | 2/2006 | Ito et al. ..................... 219/702 |

* cited by examiner

Primary Examiner—Tuyet Thi Vo
(74) Attorney, Agent, or Firm—Blakely Sokoloff Taylor & Zafman (57) ABSTRACT

A magnetron oscillating apparatus includes a magnetron, power supply unit, and switch circuit. The magnetron oscillates a microwave. The power supply unit applies a power to the magnetron. The switch circuit is connected between the power supply unit and the cathode of the magnetron and turned on/off on the basis of a control signal. When the switch circuit is turned on by the control signal, a voltage is applied between the cathode and the grounded anode of the magnetron to cause the magnetron to pulse-oscillate.

11 Claims, 8 Drawing Sheets

MAGNETRON OSCILLATING APPARATUS

BACKGROUND OF THE INVENTION

The present invention relates to a magnetron oscillating apparatus and, more particularly, to a magnetron oscillating apparatus which oscillates a microwave by applying a voltage between the cathode and the grounded anode of the magnetron.

In manufacturing semiconductor integrated circuits, plasma processing apparatuses are used, which execute processes such as crystal growth, etching, and ashing by the effect of plasma produced by a microwave. In plasma processing apparatuses of this type, a magnetron is often used as a microwave oscillator.

A magnetron forms an electric field between the cathode and the anode and oscillates a microwave by the interaction between electrons emitted from the cathode toward the anode and a magnetic field applied in the direction perpendicular to the electric field. The magnetron is inexpensive and efficient for it.

Figure 8:
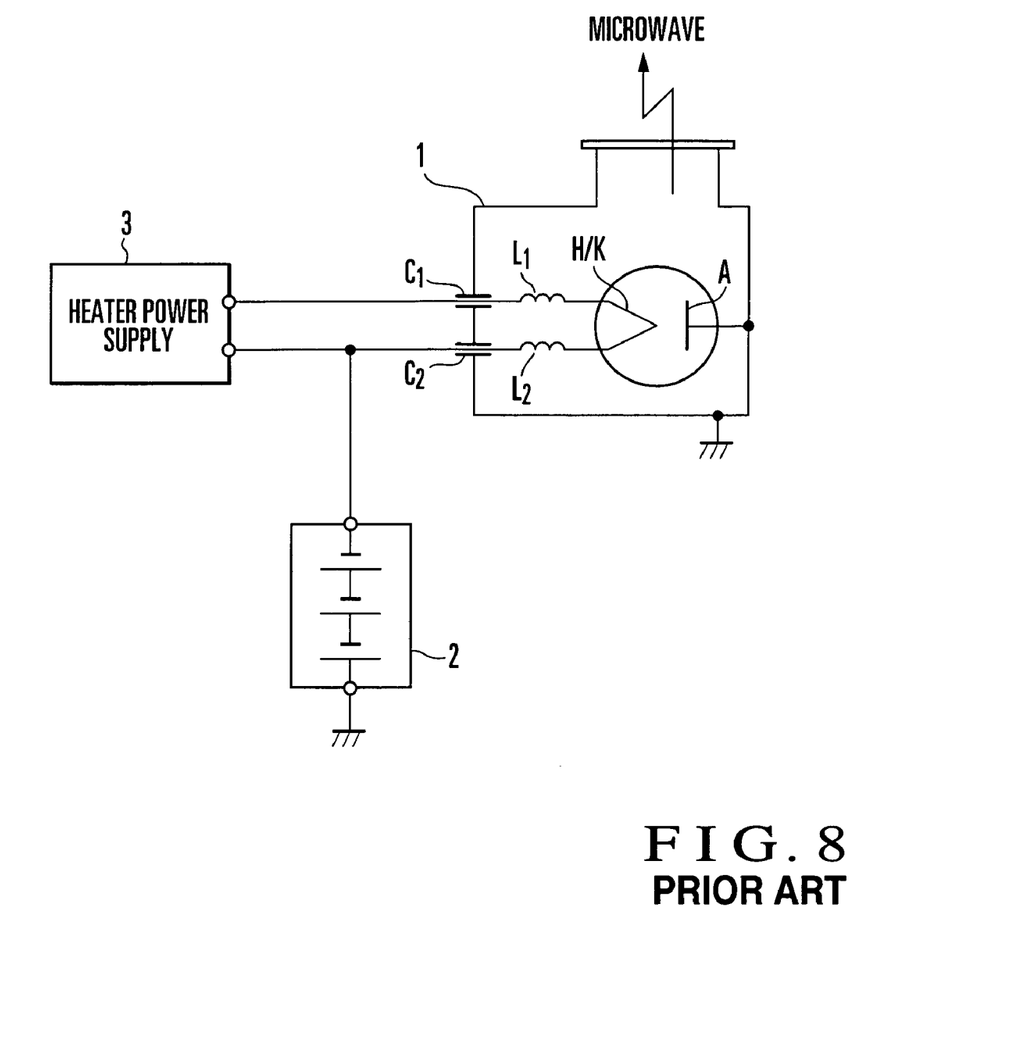
FIG. 8 is a block diagram showing the arrangement of a conventional magnetron oscillating apparatus.

FIG. 8 shows the arrangement of a conventional magnetron oscillating apparatus. Referring to FIG. 8, a magnetron 1 has a heater/cathode H/K in which a cathode and a heater are integrated, and an anode A. The anode A composed of a plurality of vanes and is provided concentrically with respect to the cathode K. A resonator is formed by spaces partitioned by the vanes.

The heater power supply 3 is connected to the two terminals of the heater/cathode H/K. When the heater power supply 3 supplies a current to the heater/cathode H/K, the heater/cathode H/K is heated and emits electrons.

The anode power supply 2 serving as a power supply unit is connected to one terminal of the heater/cathode H/K. When a negative voltage with respect to the anode A connected to ground is applied from the anode power supply 2 to the heater/cathode H/K, an electric field is formed between the heater/cathode H/K and the anode A. The heater/cathode H/K emits electrons toward the anode A.

The low-pass filter composed of coils L1 and L2 and capacitors C1 and C2 is provided between the heater/cathode H/K and the power supplies 2 and 3 to prevent energy of the microwave generated by the magnetron 1 from flowing into the anode power supply 2 and heater power supply 3. The coils L1 and L2 are connected between the two terminals of the heater/cathode H/K and the capacitors C1 and C2. Feed through capacitors inserted in through holes for formed at the case are used as capacitor C1 and C2 to connect from the heater/cathode H/K to the outside. The capacitors C1 and C2 correspond to capacitors which are connected between ground and the connection points between the coils L1 and L2 and the heater power supply 3.

In the above-described conventional magnetron oscillating apparatus, a voltage is applied from the anode power supply 2 to make the magnetron 1 oscillate. When plasma is produced by a microwave power obtained in this way, high-density plasma can be obtained at a low pressure. This plasma also has an electron temperature lower than plasma produced by a high-frequency which has a frequency lower than the microwave.

However, in a plasma processing apparatus including the conventional magnetron oscillating apparatus, for example, when etching is executed to form a fine contact hole in a silicon oxide film, the selectivity for underlying silicon decreases. Additionally, abnormal side etching or dielectric breakdown occurs due to accumulated charges in etching a gate polysilicon electrode. For this reason, micropatterning for a line width of 1 μm or less is difficult.

SUMMARY OF THE INVENTION

It is a principal object of the present invention to provide a magnetron oscillating apparatus capable of further reducing the electron temperature of plasma and maintaining a high plasma density.

In order to achieve the above object, according to the present invention, there is provided a magnetron oscillating apparatus comprising a magnetron which oscillates a microwave, a power supply unit which applies a power to the magnetron, and a switch circuit which is connected between the power supply unit and a cathode of the magnetron and turned on/off on the basis of a control signal, wherein when the switch circuit is turned on by the control signal, a voltage is applied between the cathode and a grounded anode of the magnetron to cause the magnetron to pulse-oscillate.

DESCRIPTION OF THE PREFERRED EMBODIMENTS

The embodiments of the present invention will be described below with reference to the accompanying drawings. The same reference numerals as in FIG. 8 denote the same or corresponding constituent elements throughout the drawings, and a description thereof will appropriately be omitted.

(First Embodiment)

Figure 1:
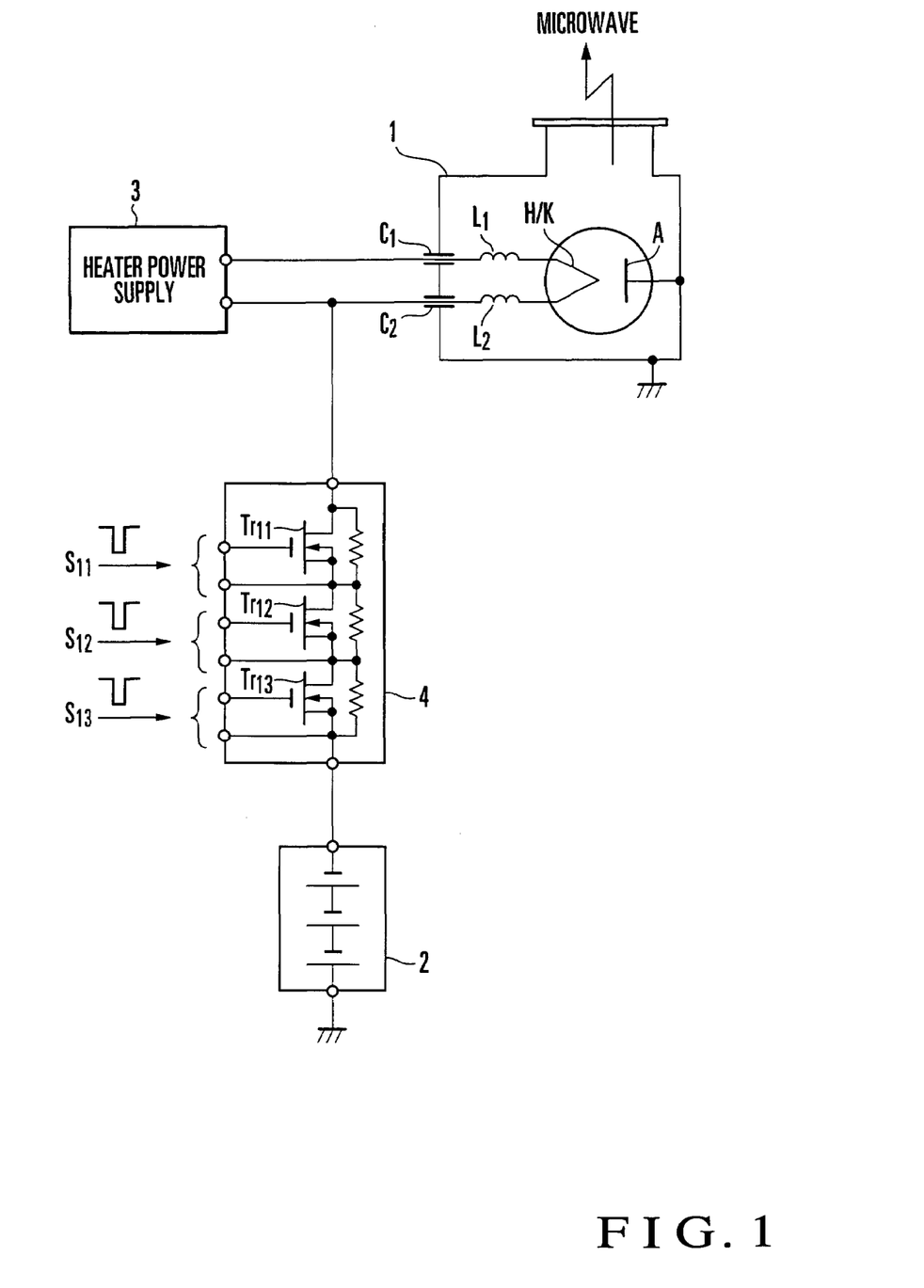
FIG. 1 is a block diagram showing the arrangement of a magnetron oscillating apparatus according to the first embodiment of the present invention.

FIG. 1 shows the arrangement of a magnetron oscillating apparatus according to the first embodiment of the present invention. In the magnetron oscillating apparatus shown in FIG. 1, a switch circuit 4 is provided on the output side of an anode power supply (power supply unit) 2.

In the switch circuit 4, three switching elements Tr11, Tr12, and Tr13 are connected in series. The switching elements Tr11, Tr12, and Tr13 are turned on/off by the polarities of first input control signals S11, S12, and S13, respectively.

For example, when the switching elements Tr11, Tr12, and Tr13 are n-channel MOSFETs, they are turned on when the polarities of the control signals S11, S12, and S13 are positive with respect to the sources and off when the polarities are negative. When the switching elements Tr11 to Tr13 of the switch circuit 4 are ON, a negative voltage from the anode power supply 2 is output to a heater/cathode H/K. When the switching elements Tr11 to Tr13 are OFF, the output of the negative voltage is stopped. When the polarities of the control signals S11, S12, and S13 are periodically changed, a voltage is intermittently applied between the heater/cathode H/K and an anode A in accordance with the periods of the control signals S11, S12, and S13.

As a result, an electric field is formed intermittently between the heater/cathode H/K and the anode A. By the energy of the electric field, a magnetron 1 oscillates, and an intermittent microwave is output. In the case of Plasma is produced by the microwave and when energy supply for the microwave to the plasma is stopped, the electron temperature of plasma decreases. However, the plasma density rarely changes, and a high plasma density is maintained. That is, plasma with a low electron temperature and high plasma density can be obtained.

When pulse signals with a short polarity change period are used as the control signals S11, S12, and S13, the magnetron 1 pulse-oscillates, and a pulse-shaped microwave is output. When the microwave is ON, the plasma density becomes high because of energy supply from the microwave to plasma. When the microwave is OFF, the electron temperature of plasma decreases while the plasma density rarely changes. Hence, plasma with a low electron temperature and high plasma density can be obtained. When this magnetron oscillating apparatus is used in a plasma processing apparatus, finer micropatterning than before can be executed in manufacturing, e.g., a semiconductor integrated circuit.

The switch circuit 4 may be composed of one switching element. The number of switching elements is not limited to three, and a plurality of switching elements may be connected in series. In this case, when an abnormal voltage is applied across the switch circuit 4, the abnormal voltage is divided. Since the applied voltage per switching element decreases, damage can be prevented. Alternatively, a plurality of switching elements may be connected in parallel. In this case, when an abnormal current flows into the switch circuit 4, the abnormal current is shunted. Since the abnormal current flowing into each switching element decreases, damage can be prevented. An IGBT (Insulated-Gate Bipolar Transistor), FET (Field Effect Transistor), or thyristor may be used as the switching element.

As the anode power supply 2, a switching regulator may be used. When the switching regulator is used, the output voltage of the anode power supply 2 can be stabilized. Hence, a stable microwave output can be obtained from the magnetron 1.

(Second Embodiment)

Figure 2A:
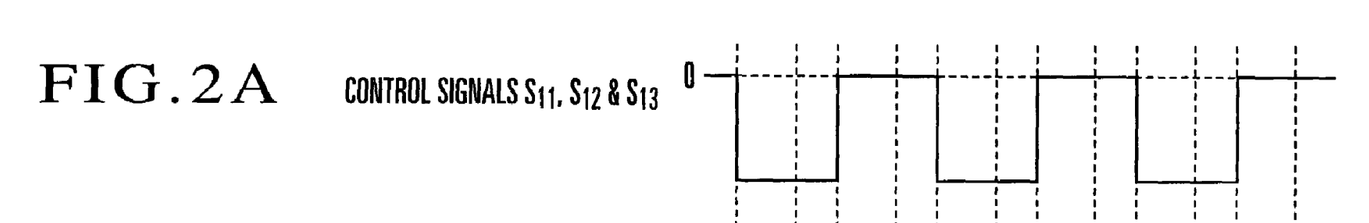
FIG. 2 is a graph showing the relationship between the waveform (a) of the first control signal and the waveform (b) of the voltage between the heater/cathode and the anode.
Figure 2B:
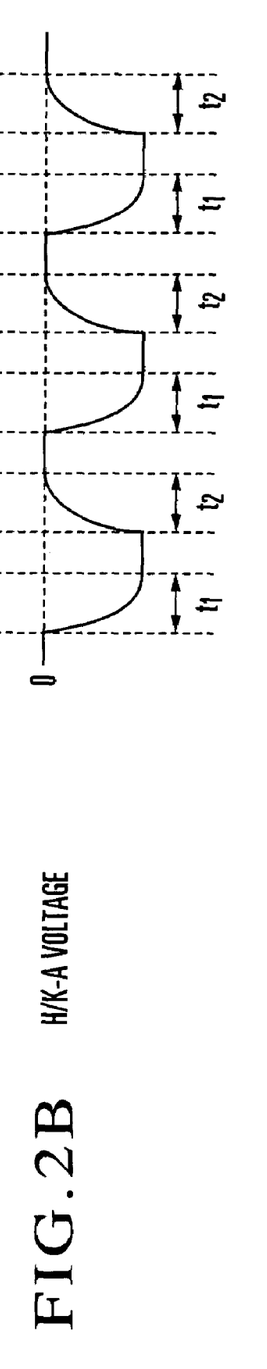

In the magnetron oscillating apparatus according to the first embodiment, a time constant is present which is the product of the resistance component of the output impedance of the anode power supply 2 viewed from the magnetron 1 and the capacitance value of the capacitors C1 and C2. This time constant has a great influence on the rise time and fall time of the voltage applied from the anode power supply 2 between the heater/cathode H/K and the anode A. Even when a pulse waveform as shown in FIG. 2A is used as the control signals S11, S12, and S13, the anode voltage rises and falls with a delay, and the waveform shown in FIG. 2B is obtained. For example, when the resistance component of the output impedance of the anode power supply 2 is about 7 kΩ, and the capacitance value of the capacitors C1 and C2 is about 2,000 pF, a rise time t1 and fall time t2 of the voltage become about 20 to 50 μs. The magnetron 1 oscillates by the voltage applied between the heater/cathode H/K and the anode A. For this reason, the intermittent microwave power output from the magnetron 1 also rises and falls with a delay, like the waveform shown in FIG. 2B.

Since the microwave rises and falls with a delay, the ON/OFF period of the microwave cannot be shortened. In addition, since no steep pulse rise waveform is formed, the production efficiency of plasma afterglow which has an important function in the plasma processing decreases.

In the second embodiment, a magnetron oscillating apparatus having a charge circuit to make the microwave quickly rise will be described.

Figure 3:
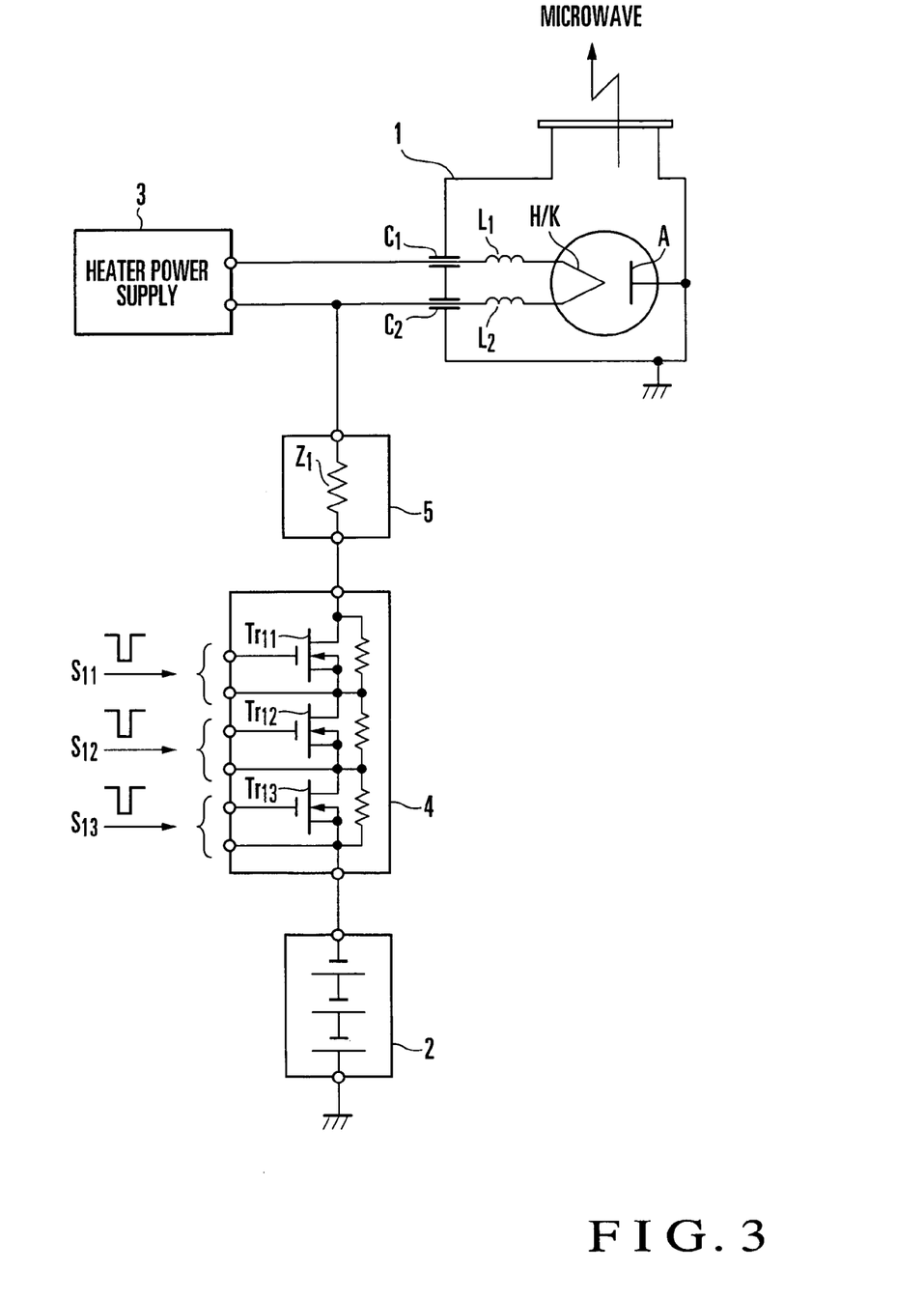
FIG. 3 is a block diagram showing the arrangement of a magnetron oscillating apparatus according to the second embodiment of the present invention.

FIG. 3 shows the arrangement of a magnetron oscillating apparatus according to this embodiment. The same reference numerals as in FIG. 1 denote the same or corresponding constituent elements in FIG. 3, and a description thereof will appropriately be omitted.

The magnetron oscillating apparatus shown in FIG. 3 includes a charge circuit 5. The charge circuit 5 is connected in series between a switch circuit 4 and the connection point between a capacitor C2 and a heater power supply 3. The charge circuit 5 includes an impedance circuit Z1. To make the output impedance of an anode power supply 2 lower than Z1, a capacitor is added on the output side of the anode power supply 2, or the anode power supply 2 has a constant voltage characteristic.

When the charge circuit 5 is provided, the current output from the anode power supply 2 is determined by the resistance value of the impedance Z1. When the output impedance of the anode power supply 2 is much lower than the resistance value of the impedance circuit Z1, the resistance value on the side of the anode power supply 2 viewed from the magnetron 1 is almost the same as the resistance value of the impedance circuit Z1.

Hence, the time constant which is determined by the product of the resistance value on the side of the anode power supply 2 viewed from the magnetron 1 and the capacitance value of capacitors C1 and C2 is determined by the resistance value of the impedance Z1. Hence, when the resistance value of the impedance Z1 is appropriately selected, the rise time can be controlled.

When the switch circuit 4 is changed from OFF to ON, the capacitors C1 and C2 are quickly charged by the output voltage from the anode power supply 2. As a result, the rise time of the voltage applied between a heater/cathode H/K and an anode A, and hence, a rise time t1 of the microwave are shortened. When the resistance value of the impedance circuit Z1 is appropriately selected, the rise time t1 can be 1 μs or less.

According to this embodiment, even when the microwave ON/OFF period is shortened, the ON time is not shortened by the delay of rising of the microwave. Hence, the plasma production efficiency can be maintained.

As described above, when the charge circuit 5 is provided, and the operation with the constant current characteristic is performed, the oscillation operation of the magnetron 1 can be stabilized, and a stable microwave output can be obtained.

At the time of oscillation of the magnetron 1, the output from the anode power supply 2 is applied to the heater/cathode H/K of the magnetron 1 through the impedance circuit Z1 of the charge circuit 5. For this reason, any excessive current supply to the magnetron 1 can be suppressed by the resistance value of the impedance circuit Z1.

(Third Embodiment)

As described above, in the magnetron oscillating apparatus according to the first embodiment, falling of the microwave output from the magnetron 1 delays. As a result, since no steep pulse fall waveform is formed, the production efficiency of plasma afterglow which has an important function in the plasma processing decreases.

In the third embodiment, a magnetron oscillating apparatus having a discharge circuit to make the microwave quickly fall will be described.

Figure 4:
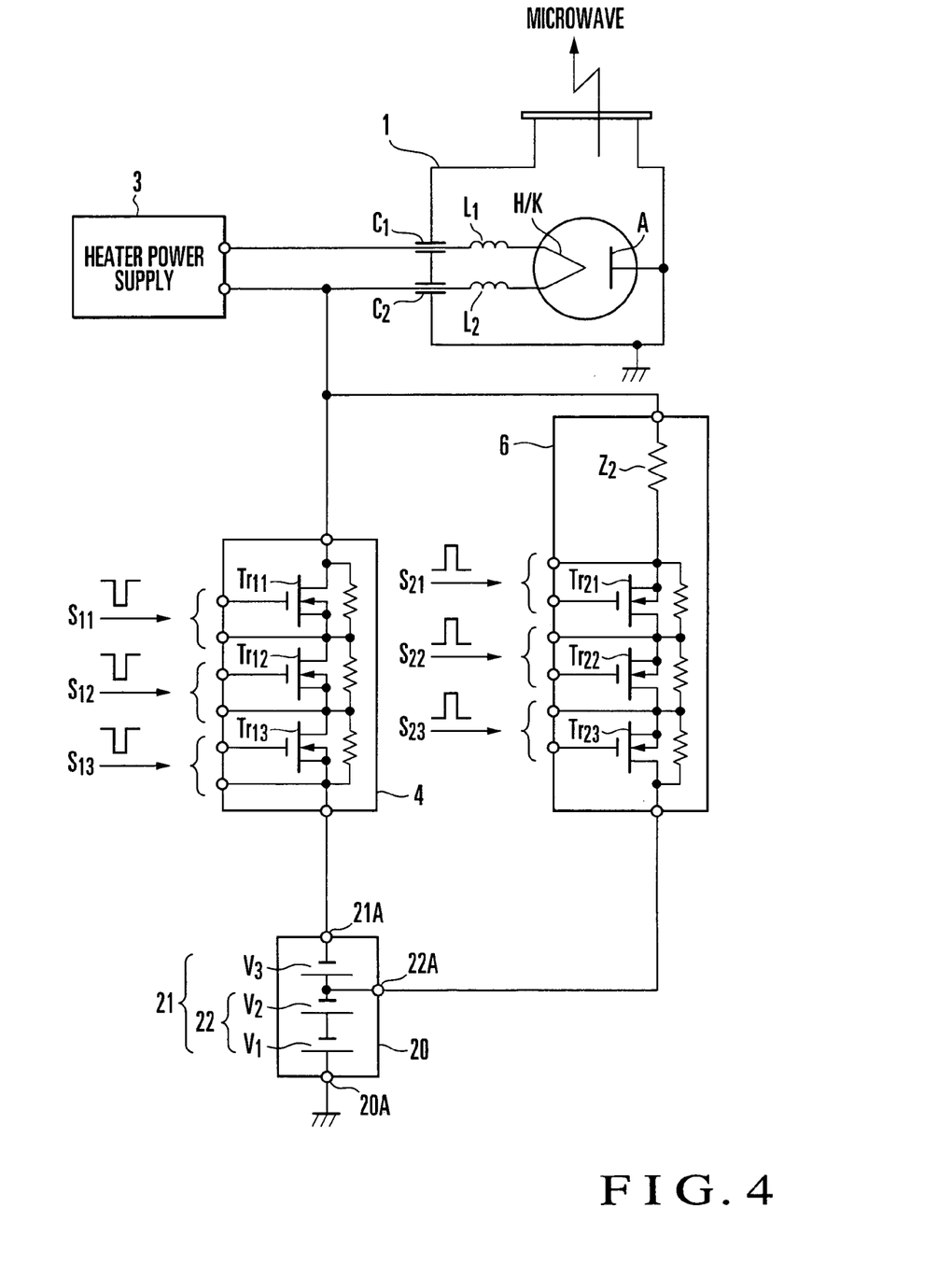
FIG. 4 is a block diagram showing the arrangement of a magnetron oscillating apparatus according to the third embodiment of the present invention.

FIG. 4 shows the arrangement of a magnetron oscillating apparatus according to this embodiment. The same reference numerals as in FIG. 1 denote the same or corresponding constituent elements in FIG. 4, and a description thereof will appropriately be omitted.

The magnetron oscillating apparatus shown in FIG. 4 has a discharge circuit 6 which removes charges stored in capacitors C1 and C2 when the applied voltage to a magnetron 1 is stopped. An anode power supply 20 is used in place of the anode power supply 2.

The anode power supply 20 incorporates a first power supply 21 including a plurality of voltage sources V1, V2, and V3 connected in series, and a second power supply 22 including two voltage sources V1 and V2 on the ground side. As the voltage sources V1 to V3, a switching regulator may be used. The ground terminals of the first power supply 21 and second power supply 22 serve as a ground terminal 20A. The output terminal of the first power supply 21 serves as a first output terminal 21A. The output terminal of the second power supply 22 serves as a second output terminal 22A. Since the number of voltage sources is smaller in the second power supply 22 than in the first power supply 21, the second output terminal 22A outputs a voltage (absolute value) smaller than that from the first output terminal 21A.

A switch circuit 4 is connected between the first output terminal 21A of the anode power supply 20 and the connection point between the capacitor C2 and a heater power supply 3. The discharge circuit 6 is connected between the connection point and the second output terminal 22A of the anode power supply 20.

In the discharge circuit 6, three switching elements Tr21, Tr22, and Tr23 and an impedance circuit Z2 are connected in series. The switching elements Tr21, Tr22, and Tr23 are turned on/off by the polarities of input second control signals S21, S22, and S23, respectively.

Figure 5A:
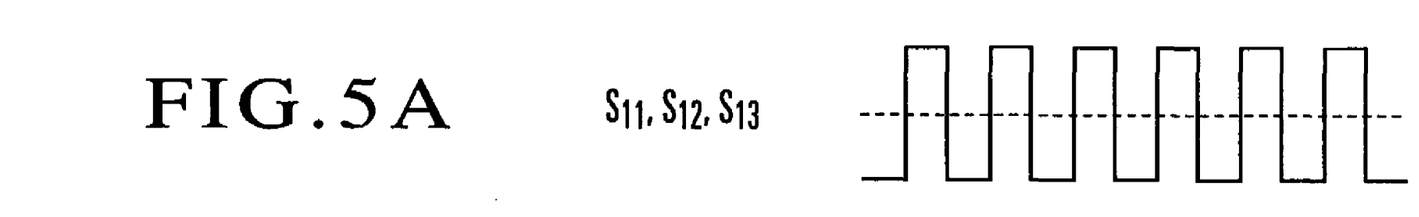
FIG. 5 is a graph showing the relationship between the waveform (a) of the first control signal and the waveform (b) of the second control signal.
Figure 5B:
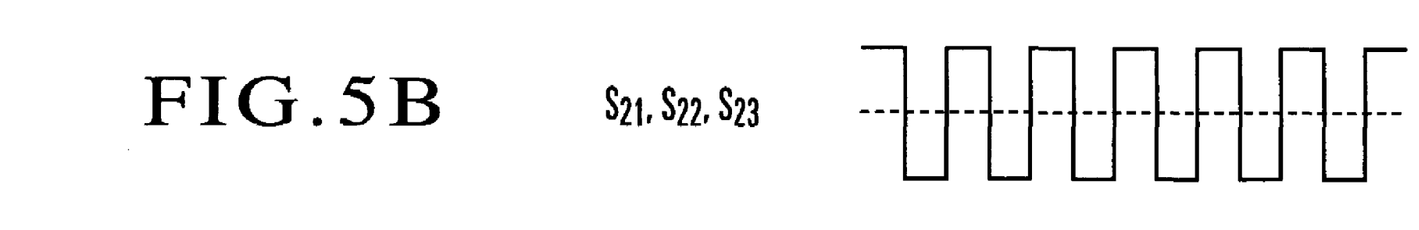

As shown in FIG. 5, control signals S11, S12, and S13 and the control signals S21, S22, and S23 have opposite polarities. At the leading edge of a pulse, switching elements Tr11 to Tr13 of the switch circuit 4 are turned on. At the trailing edge of the pulse, the switching elements Tr21 to Tr23 of the discharge circuit 6 are turned on. That is, when the switch circuit 4 is turned on or off, the discharge circuit 6 is turned off or on.

The impedance circuit Z2 connected in series with the switching elements Tr21 to Tr23 has a value to quickly discharge electric charges stored in the capacitors C1 and C2.

The operation of this embodiment will be described next.

When the polarities of the first control signals S11, S12, and S13 are positive, and the polarities of the second control signals S21, S22, and S23 are negative, the switch circuit 4 is turned on, and the discharge circuit 6 is turned off. At this time, the output voltage from the first output terminal 21A of the anode power supply 20 charges the capacitors C1 and C2 and is also applied between a heater/cathode H/K and an anode A of the magnetron 1 to make it oscillate.

After that, when the polarities of the first control signals S11, S12, and S13 and second control signals S21, S22, and S23 are inverted to negative and positive, respectively, the switch circuit 4 is turned off, and the discharge circuit 6 is turned on. At this time, the output voltage from the first output terminal 21A of the anode power supply 20 is cut off by the switch circuit 4. The output voltage from the second output terminal 22A of the anode power supply 20 is lower than the voltage of the charged capacitors C1 and C2. For this reason, the charges stored in the capacitors C1 and C2 are discharged to the second output terminal 22A of the anode power supply 20 through the discharge circuit 6 in the ON state. With this operation, the voltage between the heater/cathode H/K and the anode A decreases, and oscillation of the magnetron 1 stops.

In the discharge circuit 6, the impedance circuit Z2 is connected in series with the switching element Tr21 on the side of the magnetron 1. Hence, by the same function as the impedance circuit Z1 in the second embodiment, the resistance value on the side of the anode power supply 20 (second power supply 22) viewed from the magnetron 1 decreases. The time constant which is the product of the resistance value and the capacitance value of the capacitors C1 and C2 also decreases. For this reason, the capacitors C1 and C2 are quickly discharged. As a result, a fall time t2 of the voltage between the heater/cathode H/K and the anode A, and hence, the fall time of the microwave are shortened. When the resistance value of the impedance circuit Z2 is appropriately selected, the fall time t2 can be 1 µs or less.

According to this embodiment, the microwave ON/OFF period can be shortened. In addition, charges stored in the capacitors C1 and C2 can quickly be discharged to stop oscillation of the magnetron 1, and any decrease in afterglow production efficiency can be prevented.

The discharge circuit 6 may be composed of one switching element. The number of switching elements is not limited to three, and a plurality of switching elements may be connected in series. Alternatively, a plurality of switching elements may be connected in parallel. An IGBT, FET, or thyristor may be used as the switching element.

The anode power supply 20 incorporates the first power supply 21 and second power supply 22. However, the first power supply 21 and second power supply 22 may separately be provided.

(Fourth Embodiment)

Figure 6:
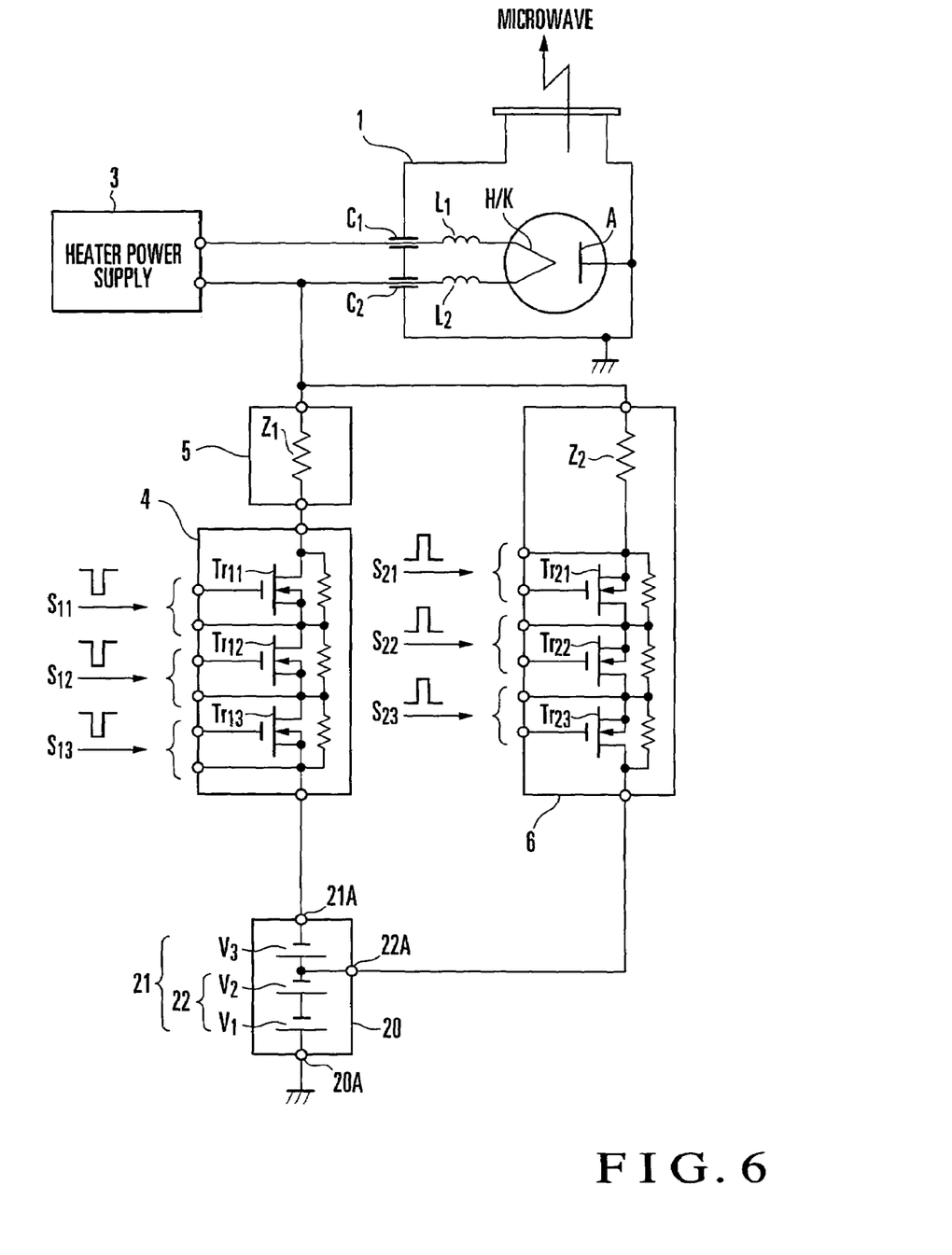
FIG. 6 is a block diagram showing the arrangement of a magnetron oscillating apparatus according to the fourth embodiment of the present invention.

FIG. 6 shows the arrangement of a magnetron oscillating apparatus according to the fourth embodiment of the present invention. The same reference numerals as in FIGS. 1, 3, and 4 denote the same or corresponding constituent elements in FIG. 6, and a description thereof will appropriately be omitted.

The magnetron oscillating apparatus shown in FIG. 6 includes both a charge circuit 5 of the second embodiment and a discharge circuit 6 of the third embodiment. With this arrangement, each of a rise time t1 and fall time t2 of a microwave by intermittent oscillation of a magnetron 1 can be shortened to, e.g., 1 µs or less. Hence, the microwave ON/OFF period as a pulse oscillation condition to be described next can be shortened to about 40 µs. That is, each of the microwave ON and OFF times can be shortened to about 20 µs.

For about 20 µs after the microwave is turned off, the electron temperature of plasma decreases while the plasma density is maintained, although it slightly changes depending on the plasma production method such as ECR plasma, inductively coupled plasma, or helicon wave plasma. For this reason, when the microwave ON/OFF period is shortened to about 40 μs or less, the electron temperature of plasma can be reduced while maintaining the plasma production efficiency. In addition, a high plasma density can be maintained. When this magnetron oscillating apparatus is used in a plasma processing apparatus, fine micropatterning for a line width of 1 μm or less can be executed in manufacturing, e.g., a semiconductor integrated circuit.

(Fifth Embodiment)

A magnetron oscillating apparatus according to the fifth embodiment of the present invention can prevent damage to each part by an abnormal current.

Figure 7:
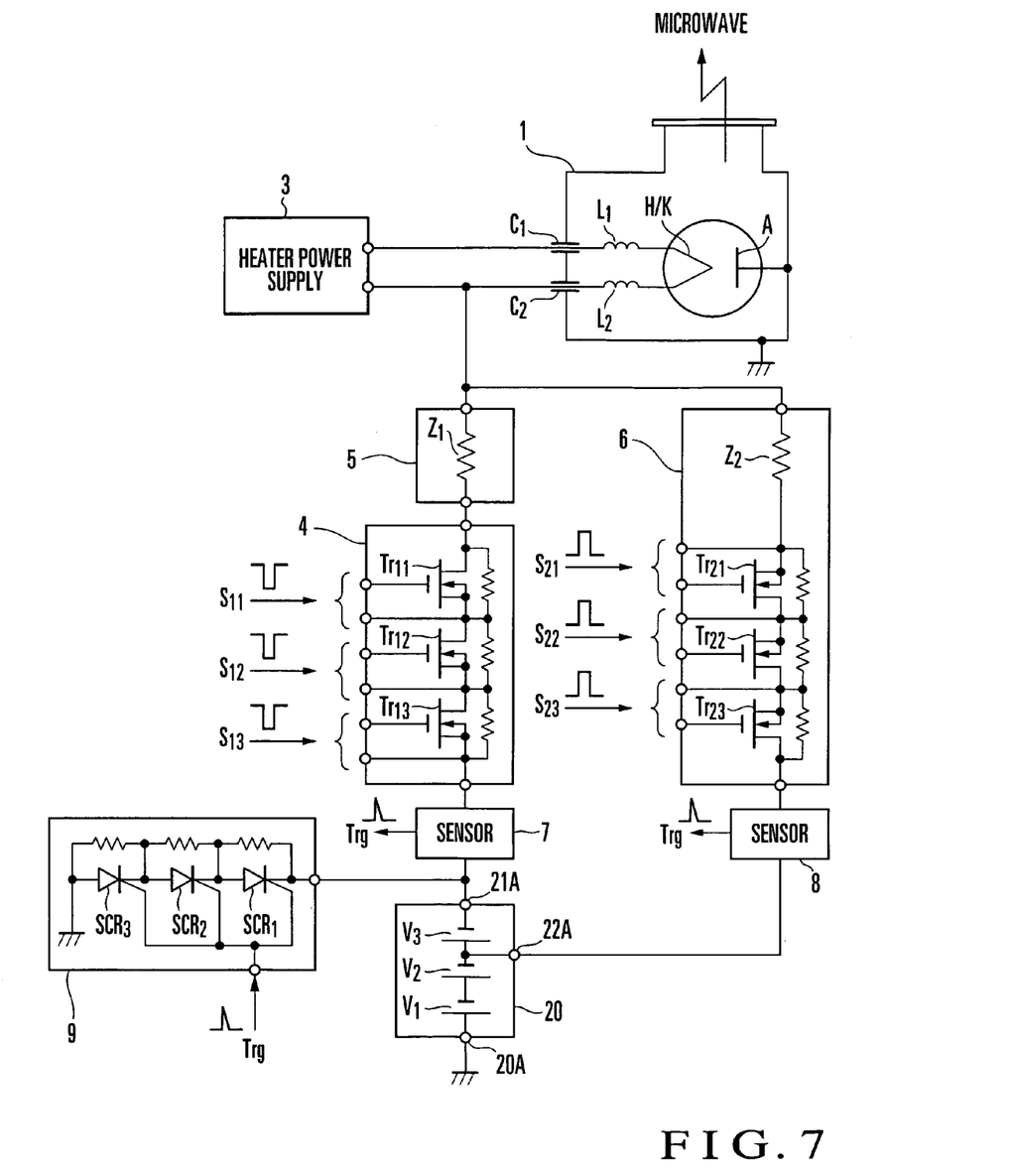
FIG. 7 is a block diagram showing the arrangement of a magnetron oscillating apparatus according to the fifth embodiment of the present invention.

FIG. 7 shows the arrangement of the magnetron oscillating apparatus. The same reference numerals as in FIGS. 1, 3, 4, and 6 denote the same or corresponding constituent elements in FIG. 7, and a description thereof will appropriately be omitted.

The magnetron oscillating apparatus shown in FIG. 7 has sensors 7 and 8 serving as abnormality detection circuits, and a protection circuit 9. The sensor 7 is connected to a first output terminal 21A of an anode power supply 20 in series with a switch circuit 4 to detect an abnormal current flowing to the switch circuit 4. The sensor 8 is connected to a second output terminal 22A of the anode power supply 20 in series with a discharge circuit 6 to detect an abnormal current flowing to the discharge circuit 6. Upon detecting an abnormal current, both the sensors 7 and 8 output a trigger Trg as an abnormality detection signal to the protection circuit 9.

The protection circuit 9 is connected to the first output terminal 21A of the anode power supply 20. Upon receiving the trigger Trg, the protection circuit 9 short-circuits the first output terminal 21A to ground. In the protection circuit 9, three switching elements SCR1, SCR2, and SCR3 are connected in series. The switching elements are normally OFF. Only when the trigger Trg is input, they are turned on to short-circuit the first output terminal 21A of the anode power supply 20 to ground.

With this arrangement, when an abnormal current is generated, the first output terminal 21A of the anode power supply 20 is instantaneously short-circuited to ground, and the anode power supply 20 is forcibly turned off. Hence, damage to a magnetron 1, switch circuit 4, and discharge circuit 6 by the abnormal current can be prevented.

The protection circuit 9 may be composed of one switching element. The number of switching elements is not limited to three, and a plurality of switching elements may be connected in series. Alternatively, a plurality of switching elements may be connected in parallel. An IGBT, FET, or thyristor may be used as the switching element.

The anode power supply 20 incorporates a first power supply 21 and second power supply 22. When the first power supply 21 and second power supply 22 are separately provided, a protection circuit is provided for each of the first output terminal 21A of the first power supply 21 and the second output terminal 22A of the second power supply 22. In either case, the connection positions are not limited and can appropriately be set.

The sensors 7 and 8 are connected to the first output terminal 21A of the anode power supply 20. However, the connection positions of the sensors 7 and 8 are not limited to these places. A sensor to detect an electromagnetic wave which causes an operation error of switching elements Tr11, Tr12, and the like included in the switch circuit 4 and discharge circuit 6 may be used. In this case, the sensor is preferably arranged at an optimum position for electromagnetic wave detection.

The magnetron oscillating apparatus according to the present invention can be used in a plasma processing apparatus for manufacturing a semiconductor integrated circuit.

In the magnetron oscillating apparatus according to the present invention, when the switch circuit turns on/off connection between the cathode of the magnetron and the power supply unit on the basis of the control signals, an electric field is intermittently formed between the cathode and anode so that the magnetron intermittently oscillates. When plasma is produced by an intermittent microwave obtained in this way, the electron temperature of the plasma decreases while maintaining a high plasma density when energy supply from the microwave to the plasma is stopped. When this magnetron oscillating apparatus is used in a plasma processing apparatus, finer micropatterning than before can be executed in manufacturing, e.g., a semiconductor integrated circuit.

When the charge circuit is connected in series with the switch circuit, and the resistance value of the charge circuit is appropriately selected, the time constant is determined by the resistance value and the capacitance value of the capacitors connected between the cathode and ground. When the switch circuit is switched from OFF to ON, the rise time of the electric field between the cathode and anode, and hence, the rise time of the microwave by intermittent oscillation can be controlled.

Connection between the capacitors and the second power supply or the second terminal of the power supply unit is turned on/off by the discharge switch circuit included in the discharge circuit which complementarily operates with respect to the switch circuit. The absolute value of the output voltage from the second power supply or the second terminal of the power supply unit is smaller than that from the first power supply or the first terminal of the power supply unit. For this reason, charges in the capacitors which are charged by the first power supply or the first terminal of the power supply unit when the switch circuit is ON are discharged to the second power supply or the second terminal of the power supply unit through the discharge circuit which is turned on when the switch circuit is turned off. When the discharge switch circuit is turned on, the fall time of the electric field between the cathode and anode, and the fall time of the microwave by intermittent oscillation are shortened.

The current flowing to the second power supply or the second terminal of the power supply unit is limited by the discharge resistance contained in the discharge circuit. In this state, oscillation of the magnetron stops by the fall time which is determined by the time constant obtained as the product of the capacitance value of the capacitors and the resistance value which is viewed from the magnetron to the second power supply or the second terminal of the power supply unit.

An abnormality which occurs in the switch circuit or the like is detected by the abnormality detection circuit. When an abnormality is detected, the connection point between, e.g., the power supply unit and the switch circuit is connected to ground. With this operation, the power supply unit is turned off, and damage to the switch circuit or the like by the abnormal current can be prevented.

Each of the switch circuit, discharge circuit, and protection circuit includes a plurality of switching elements connected in series or parallel. With this arrangement, damage to the switching elements by an abnormal voltage or abnormal current can be prevented.

What is claimed is:

1. A magnetron oscillating apparatus comprising:
a magnetron which oscillates a microwave;
a power supply unit which applies a power to said magnetron;
a switch circuit which is connected between said power supply unit and a cathode of said magnetron and turned on/off on the basis of a control signal, wherein when said switch circuit is turned on by the control signal, a voltage is applied between the cathode and a grounded anode of said magnetron to cause said magnetron to pulse-oscillate; and
a charge circuit which is connected between the cathode and said switch circuit, wherein a rise time of pulse oscillation of said magnetron is controlled.

2. An apparatus according to claim 1, further comprising
an abnormality detection circuit which detects an abnormality which occurs at least in said switch circuit and outputs an abnormality detection signal, and
a protection circuit which connects a connection point between said power supply unit and said switch circuit to ground upon receiving the abnormality detection signal.

3. An apparatus according to claim 1, further comprising
an abnormality detection circuit which detects an abnormality which occurs at least in said switch circuit and outputs an abnormality detection signal, and
a protection circuit which connects a connection point between said power supply unit and said switch circuit to ground upon receiving the abnormality detection signal.

4. An apparatus according to claim 1, wherein
said power supply unit is used as a first power supply, and a second power supply whose absolute value of an output voltage is smaller than that of the first power supply is provided,
the apparatus further comprises a discharge circuit which includes a discharge resistance and a discharge switch circuit which is connected between the cathode and the second power supply and turned on/off complementarily with said switch circuit, and
a fall time of pulse oscillation of said magnetron is controlled.

5. An apparatus according to claim 4, further comprising
an abnormality detection circuit which detects an abnormality which occurs at least in said switch circuit and outputs an abnormality detection signal, and
a protection circuit which connects one of a connection point between said first power supply and said switch circuit and a connection point between said second power supply and said discharge circuit to ground upon receiving the abnormality detection signal.

6. An apparatus according to claim 1, wherein
said power supply unit is used as a first power supply, and a second power supply whose absolute value of an output voltage is smaller than that of the first power supply is provided,
the apparatus further comprises a discharge circuit which includes a discharge resistance and a discharge switch circuit which is connected between the cathode and the second power supply and turned on/off complementarily with said switch circuit, and
a fall time of pulse oscillation of said magnetron is controlled.

7. An apparatus according to claim 6, further comprising
an abnormality detection circuit which detects an abnormality which occurs at least in said switch circuit and outputs an abnormality detection signal, and
a protection circuit which connects one of a connection point between said first power supply and said switch circuit and a connection point between said second power supply and said discharge circuit to ground upon receiving the abnormality detection signal.

8. An apparatus according to claim 1, wherein
said power supply unit has two output terminals, and one of said output terminals which has a larger absolute value of an output voltage is defined as a first output terminal, and the other is defined as a second output terminal,
the apparatus further comprises a discharge circuit which includes a discharge resistance and a discharge switch circuit which is connected between the cathode and said second output terminal and turned on/off complementarily with said switch circuit, and
a fall time of pulse oscillation of said magnetron is controlled.

9. An apparatus according to claim 8, further comprising
an abnormality detection circuit which detects an abnormality which occurs at least in said switch circuit and outputs an abnormality detection signal, and
a protection circuit which connects one of a connection point between said first output terminal and said switch circuit and a connection point between said second output terminal and said discharge circuit to ground upon receiving the abnormality detection signal.

10. An apparatus according to claim 1, wherein
said power supply unit has two output terminals, and one of said output terminals which has a larger absolute value of an output voltage is defined as a first output terminal, and the other is defined as a second output terminal,
the apparatus further comprises a discharge circuit which includes a discharge resistance and a discharge switch circuit which is connected between the cathode and said second output terminal and turned on/off complementarily with said switch circuit, and
a fall time of pulse oscillation of said magnetron is controlled.

11. An apparatus according to claim 10, further comprising
an abnormality detection circuit which detects an abnormality which occurs at least in said switch circuit and outputs an abnormality detection signal, and
a protection circuit which connects one of a connection point between said first output terminal and said switch circuit and a connection point between said second output terminal and said discharge circuit to ground upon receiving the abnormality detection signal.

* * * * *